United States Patent
Pai

(10) Patent No.: US 7,301,468 B2
(45) Date of Patent: Nov. 27, 2007

(54) METHOD AND APPARATUS FOR REAL TIME MONITORING OF AN ELECTRIC FURNACE HEATING COIL

(75) Inventor: Jiun-Rong Pai, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 73 days.

(21) Appl. No.: 10/910,481

(22) Filed: Aug. 3, 2004

(65) Prior Publication Data

US 2006/0028348 A1 Feb. 9, 2006

(51) Int. Cl.
*G08B 21/00* (2006.01)

(52) U.S. Cl. .............. 340/655; 340/652; 340/664; 219/510

(58) Field of Classification Search ............. 340/655, 340/652, 640, 646, 663, 664, 660; 219/510, 219/514
See application file for complete search history.

(56) References Cited

U.S. PATENT DOCUMENTS

| | | | |
|---|---|---|---|
| 3,774,189 A * | 11/1973 | Brown | 340/655 |
| 4,389,640 A * | 6/1983 | Dawdy | 340/664 |
| 4,677,533 A | 6/1987 | McDermott et al. | |
| 4,963,798 A | 10/1990 | McDermott | |
| 4,999,730 A * | 3/1991 | Pickard | 361/59 |
| 5,235,416 A | 8/1993 | Stanhope | |
| 5,668,537 A | 9/1997 | Chansky et al. | |
| 6,082,438 A * | 7/2000 | Zielinski et al. | 164/457 |

* cited by examiner

*Primary Examiner*—Jeffery Hofsass
*Assistant Examiner*—Hongmin Fan
(74) *Attorney, Agent, or Firm*—Tung & Associates

(57) ABSTRACT

Heating coils used in an electric furnace used to process semiconductor wafers are monitored on a real time basis by sensing the AC current in a power line delivering electrical power to the furnace. The AC current is sensed by a coil positioned around and magnetically coupled with the power line. The sensed AC current induces an AC voltage in the coil which is converted by an electrical circuit into a DC voltage. The DC voltage is used to control a solid state relay that generates an alarm signal when the value of the DC voltage is less than a preselected value indicating that an open circuit is present in the heating coil.

20 Claims, 1 Drawing Sheet

METHOD AND APPARATUS FOR REAL TIME MONITORING OF AN ELECTRIC FURNACE HEATING COIL

TECHNICAL FIELD

The present invention broadly relates to electric furnaces used to process semiconductor wafers, and deals more particularly with a method and apparatus for monitoring heating coils used in such furnaces, on a real time basis.

BACKGROUND ART

Electrically powered furnaces are used extensively in various processes for producing integrated circuits on semiconductor wafers. In some cases, these furnaces are used to cure wafers following a process step, while in other cases the furnaces are used to heat the wafers to a particular temperature during a process, such as oxidation or re-flow conducted on the wafer surface. Many of such processes require relatively close temperature control, otherwise the results are adversely effected. For example, when oxides are being deposited on a wafer, if there is a dramatic shift in temperature during processing, the thickness of the deposited oxide may be adversely affected, e.g. the deposited thickness is below the specified requirements.

Unexpected temperature variations in furnaces used to conduct wafer processing may result from a variety of causes. In many cases, one or more electric heating elements may fail or may operate intermittently, which in turn reduces furnace temperature. These failures are sometimes due to deterioration of heating coils due to age, which results in the coil experiencing an open circuit at the location where the coil has failed. Such temperature variations can be even more significant in so-called vertical furnaces in which the wafers are passed through a plurality of separate, vertically oriented heating zones in the furnace.

In the past, short-term swings in furnace temperature affecting wafer processing were recorded on data logs that were reviewed by an operator at the end of a process cycle. The recorded temperature swings were analyzed and appropriate corrective actions were taken by the operator prior to processing the next batch of wafers. The corrective action could include altering processing parameters for the next batch, or, where the temperatures swing was due to faulty equipment, making appropriate repairs to the furnace. Unfortunately, since the data log was reviewed only after processing cycles were completed, the entire batch of wafers often had to be scrapped since corrective action could not be taken until the process was completed.

Accordingly, there is a clear need in the art for a system that monitors the furnace heating coils on a real-time basis, and notifies an operator when an open circuit has been detected. The present invention is directed toward satisfying this need in the art.

SUMMARY OF THE INVENTION

According to one aspect of the invention, apparatus is provided for monitoring a heating coil used in an electric furnace used to process semiconductor wafers, on a real-time basis. The apparatus includes a current transducer for sensing the AC current flowing through a power line used to deliver power to the heating coil and for transforming the sensed current into a lower level AC signal. The apparatus also includes an electrical circuit for converting the lower level AC signal into a DC signal that is related to the magnitude of the sensed current, and for generating an alarm signal when the value of the DC voltage signal falls below a pre-selected level indicating that an open circuit has occurred in the heating coil. In a preferred embodiment, the current transducer comprises a toroidal coil positioned around and magnetically coupled with the power line so that the current flowing through the power line induces an electrical signal in the coil. The electrical circuit includes a rectifier for rectifying the sensed, AC voltage and a smoothing and regulating circuit for transforming the rectified signal into a DC voltage. The DC voltage is used to operate a solid-state relay for selectively activating the alarm circuit.

According to another aspect of the invention, a method is provided for monitoring a heating coil used in an electric furnace used to process semiconductor wafers, comprising the steps of sensing an AC current flowing through a power line delivering electrical power to the coil, producing a DC voltage proportional to the sensed AC current and generating an alarm signal when the DC voltage falls below a pre-selected level indicating that the coil has an open circuit.

Accordingly, it is a primary object of the invention to provide a method and apparatus for monitoring the operating status of a heating coil used in an electric furnace used to process semiconductor wafers, on a real-time basis.

Another object of the invention is to provide a method and apparatus as described above which allows corrective action to be taken to correct the open coil circuit before the open circuit results in a temperature fluctuation that adversely impacts the manufacturing process.

A still further object of the invention is to provide a method and apparatus as described above which allows real-time monitoring of the heating coil in a manner that does not affect normal operation of temperature control equipment or require substantial modification of existing equipment.

Another object of the invention is to provide heating coil monitoring apparatus as mentioned above which is simple in construction and is easily retrofitted to existing furnace installations.

These, and further objects and advantages of the present invention will be made clear or will become apparent during the course of the following description of a preferred embodiment of the present invention.

BRIEF DESCRIPTION OF THE DRAWINGS

In the drawings which form an integral part of the specification and are to be read in conjunction therewith, and in which like reference numerals are employed to designate identical components in the various views.

DESCRIPTION OF THE PREFERRED EMBODIMENT

Figure 1:
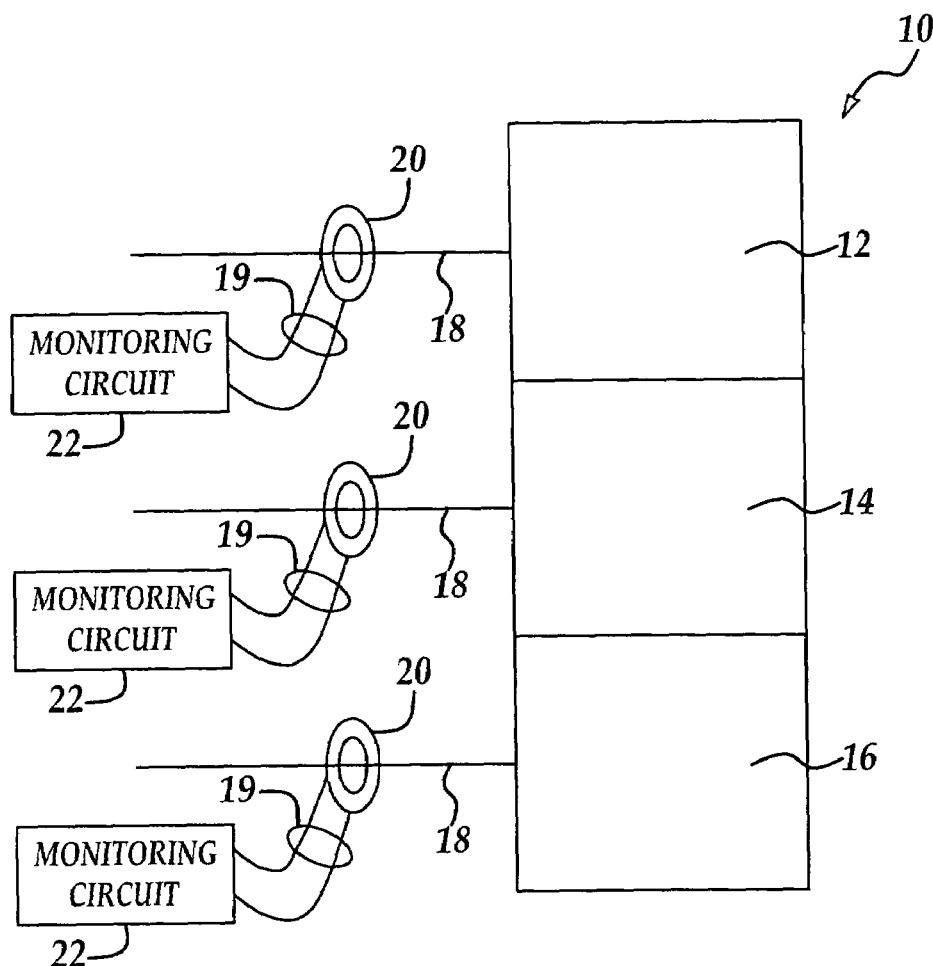
FIG. 1 is a combined block and diagrammatic view of a multi-zone furnace employing the real-time heating coil monitoring system of the present invention; and, FIG. 2 is a combined block and schematic diagram of the monitoring system shown in FIG. 1.

Referring first to FIG. 1, a furnace generally indicated by the numeral 10 of the so-called vertically oriented type includes a plurality of separately controllable furnace zones 12, 14, 16 which may have the same, or different operating temperatures. Each of the furnace zones 12-16 is heated by a series of electrical heating elements or coils (not shown) which are connected with and receive power from an electrical power line 18. The furnace 10 is controlled by an appropriate controller (not shown) such as a conventional proportional-integral derivative (PID) temperature controller having, for example, 256 resolutions and a range of zero to 100 percent of power output by controlling the trigger angle of a high powered type SCR. The furnace 10 is typically driven in a low voltage and high current mode. The magnitude of the AC current flowing through the power line 18 is related to the temperature within the corresponding furnace zones 12-16.

In accordance with the present invention, a real-time heating coil monitoring system includes a current sensing coil 20 connected with a monitoring circuit 22 which receives signals from the coil 20. The coil 20 may comprise a commercially available AC current sensor such as a CPL-24-TE, which includes a toroidal coil transformer surrounding and magnetically coupled with the power line 18 which delivers electrical current to the heating coil being monitored. AC current flowing through the power line 18 (and thus to the coil being monitored) induces a corresponding AC current ands voltage in the transducer coil 20. The AC current induced in the transducer coil 20 is of a much lower level than that in the power line 18 and is delivered via output taps and lines 19 to the monitoring circuit 22.

Figure 2:
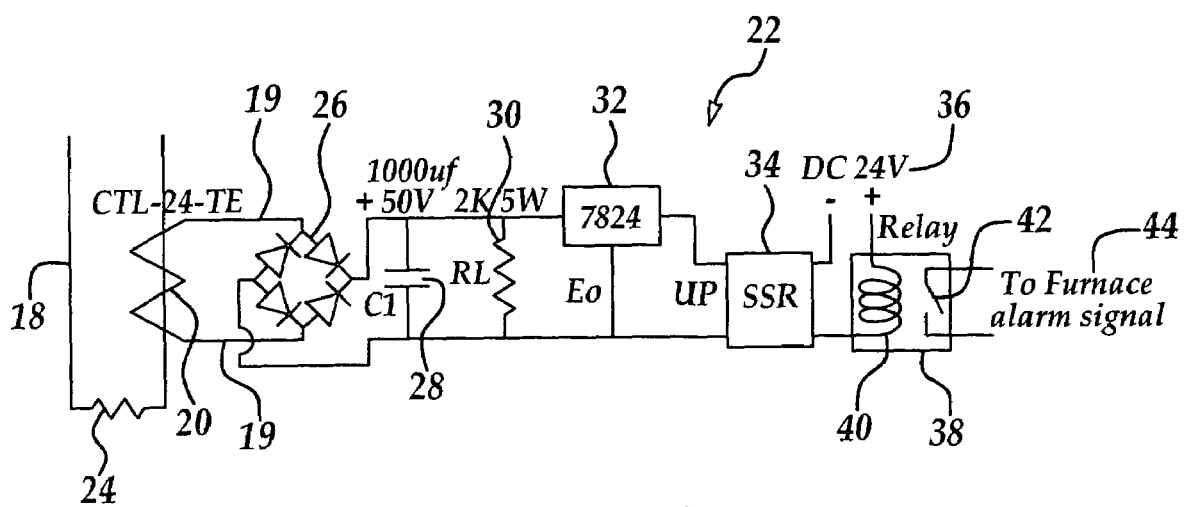

Reference is also now made to FIG. 2 which shows the details of the monitoring circuit 22. The power line 18 is depicted as delivering power to a load 24 which represents an electrical heating coil used to heat one of the furnace zones 12-16, and which is to monitored for a possible open circuit condition. As previously described, the AC current flowing through power line 18 is sensed by the transducer coil 20, and the corresponding induced current and AC voltage is delivered via lines 19 to the inputs of a full-wave rectifier bridge 26 which preferably comprises four bridge coupled Schokkty diodes. A smoothing capacitor ($_fC$) 28 and a load resistor ($_LR$) 30 are coupled in parallel across the outputs of the bridge 26. The output of the full wave rectifier bridge 26 is a DC voltage signal which is smoothed by capacitor 28.

During the first half of the voltage peaks output by the rectifier 26, as the voltage is increasing, the capacitor 28 charges up. Then, when the rectified voltage output from rectifier 26 decreases to zero in the second half of the peak, the capacitor 28 releases its stored energy to keep the output voltage as constant as possible. Despite the smoothing effect provided by the capacitor 28, some remaining "ripple" may be present in the DC signal, depending upon the value of the capacitor 28, the amount of current used by the circuit, and the frequency of the signal input to the bridge 26. In order to eliminate any remaining ripples in the DC signal, a voltage regulator 32 is employed, such as, for example, a well-known LM 7824 integrated circuit. The voltage regulator 32 converts the smoothed, DC signal ($E_o$) at its inputs to a constantly regulated output DC voltage which is then used to control a solid-state relay 34. The controlled output of the solid state relay 34 is coupled with a 24 volt DC voltage source 36 and the coil 40 of a normally closed alarm relay 38. Relay 38 includes a set of normally closed contacts 42 coupled with an alarm circuit 44 which alerts an operator that the heating circuit being monitored has an open circuit condition that requires immediate attention.

When the heating coil of the furnace 10 is operating normally (no open circuits are present), the voltage regulator 42 outputs a signal to the solid-state relay 34 causing the latter to couple relay coil 40 into circuit with the 24 volt voltage source 36. With coil 40 energized, normally closed contacts 42 are maintained in their open position. However, when the DC current induced in the transducer coil 20 drops below a certain level, as will occur when the heating coil being monitored experiences an open circuit for any reason, the input signal to the solid state relay 34 is removed, in turn disconnecting the voltage source 36 from the coil 40. With the coil 40 de-energized, contacts 42 are switched to their normally closed position, thereby closing the alarm circuit 44 and causing a signal to be issued alerting the operator of the open circuit condition in the heating coil.

It is important to appreciate at this point that the real time monitoring system as described above is not coupled directly with the internal circuit of the furnace 10, and therefore is not subject to malfunction or disturbance by these circuits. Instead, the inventive monitoring system relies on the direct relationship between current flowing through the heating coil and the magnitude of the AC current flowing through the power line 18 used to deliver electrical power to the heating coil.

From the foregoing, it is apparent that the novel method and apparatus for real-time monitoring of furnace heating coils not only provide for the reliable accomplishment of the objects of the invention, but do so in a particularly simple and economical manner. It is recognized, of course, that those skilled in the art may make various modifications or additions chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. Apparatus for real time monitoring of a heating coil circuit in an electric furnace used to process semiconductor wafers, said furnace being supplied with power by a power line connected to a source of electrical AC power, comprising a current transducer arranged to sense current flowing through said power line, said power line supplying AC power for delivery to said heating coil circuit, said current transducer adapted to transform the sensed current into a lower level current signal; and, an electrical circuit separate from said heating coil circuit, said electrical circuit adapted to convert the lower level current signal into a DC voltage signal related to the magnitude of said sensed current, said electrical circuit further adapted to generate an alarm signal when the value of the DC voltage signal falls below a preselected voltage level greater than zero.

2. The apparatus of claim 1, wherein said current transducer includes a current transducing coil coupled with said power line, the flow of AC current through said power line inducing the flow of a lower level AC current in said coil.

3. The apparatus of claim 2, wherein said electrical circuit includes means for rectifying said lower level AC current signal, and means for converting the rectified signal into said DC voltage signal.

4. The apparatus of claim 3, wherein said electrical circuit includes means for smoothing and regulating said DC voltage signal.

5. The apparatus of claim 3, wherein said electrical circuit includes means responsive to said DC voltage signal for issuing said alarm signal when the value of said DC voltage signal falls below said preselected voltage level.

6. The apparatus of claim 5, wherein said alarm signal issuing means includes an electrical relay controlled by said DC voltage signal and an alarm circuit controlled by said relay means.

7. The apparatus of claim 6, wherein said relay means includes a first, solid state relay having a control input controlled by DC voltage signal, and a second relay controlled by said solid state relay.

8. The apparatus of claim 7, wherein said alarm circuit is connected with and controlled by said second relay.

9. The apparatus of claim 2, wherein said coil circumscribes and is magnetically coupled with said power line.

10. Apparatus for detecting in real time an open circuit in a heating coil in an electric furnace used to process semiconductor wafers, said heating coil being supplied with power by a power line connected to a source of electrical AC power, comprising:
   a current sensing coil surrounding and magnetically coupled with said power line, said power line inducing an AC signal in said coil proportional in magnitude to the AC current flowing through said power line to said heating coil circuit; and,
   an electrical circuit separate from said heating coil circuit adapted to convert said AC signal into a DC voltage, said electrical circuit further adapted to generate an alarm signal when the value of said DC voltage signal falls below a preselected voltage level greater than zero.

11. The apparatus of claim 10, wherein said electrical circuit includes:
   means for rectifying said AC signal, means for smoothing the rectified signal into said DC voltage, and means for regulating said DC voltage.

12. The apparatus of claim 11, wherein said electrical circuit includes a first solid state relay having a control input controlled by said DC voltage, and a second relay having a control input controlled by said first relay and a controlled output coupled with said alarm circuit.

13. The apparatus of claim 12, wherein said rectifying means includes a diode bridge, and said smoothing means includes a capacitor.

14. A method of real time monitoring a heating coil circuit used in an electric furnace used to process semiconductor wafers, said heating coil being supplied with power by a power line connected to a source of electrical AC power, comprising the steps of:
   (A) sensing an AC current flowing through a power line delivering electrical power to said heating coil circuit, said sensing performed by an electrical circuit separate from said heating coil circuit;
   (B) producing a DC voltage proportional to the AC current sensed in step (A) with said electrical circuit;
   (C) producing an alarm signal with said electrical circuit indicating that the heating coil has an open circuit when the DC voltage produced in step (B) falls below a preselected level greater than zero.

15. The method of claim 14, wherein step (A) is performed by magnetically coupling a current sensing coil with said power line, and inducing an AC voltage in said coil.

16. The method of claim 15, wherein the magnetic coupling is performed by placing the sensing coil around said power line.

17. The method of claim 15 wherein step (B) is performed by converting said AC voltage into said DC voltage.

18. The method of claim 17, wherein said AC voltage is converted into said DC voltage by:
   rectifying said AC voltage, smoothing the rectified AC voltage, and regulating the smoothed AC voltage.

19. The method of claim 15, wherein step (C) includes operating a solid state relay to control a relay circuit containing said alarm circuit.

20. The method of claim 14, wherein step (B) is performed by rectifying an AC voltage proportional to the AC current sensed in step (A).

* * * * *